United States Patent [19]

Levy

[11] Patent Number: 5,469,379
[45] Date of Patent: Nov. 21, 1995

[54] MULTI-LEVEL VROM PROGRAMMING METHOD AND CIRCUIT

[75] Inventor: Paul S. Levy, Chandler, Ariz.

[73] Assignee: VLSI Technology, Inc., San Jose, Calif.

[21] Appl. No.: 269,804

[22] Filed: Jun. 30, 1994

[51] Int. Cl.⁶ ............................................. G11C 17/00
[52] U.S. Cl. .................. 365/96; 365/103; 365/225.7; 257/530; 257/50
[58] Field of Search .................... 365/96, 225.7, 365/104, 103; 327/525; 257/50, 530

[56] References Cited

U.S. PATENT DOCUMENTS

| | | | |
|---|---|---|---|
| 5,008,855 | 4/1991 | Eltoukhy et al. | 365/96 |
| 5,272,388 | 12/1993 | Bakker | 365/96 |
| 5,371,414 | 12/1994 | Galbraith | 365/96 |

*Primary Examiner*—David C. Nelms
*Assistant Examiner*—Vu A. Le

*Attorney, Agent, or Firm*—Lavalle D. Ptak

[57] ABSTRACT

A method and system for programming vROM programmable memories using antifuses fabricated from undoped amorphous silicon as a high resistance link or layer between two metal layers. Whenever a programming voltage higher than a normal operating voltage is applied across the link between the two metal layers, the resistance of the link is reduced by transforming the insulating amorphous silicon into conducting polysilicon. This causes a closed or conductive link to be formed between the two metal layers. In the programming of the vROM, current is actively pumped to the link; and a current measurement or check is made prior to the application of the programming voltage to determine whether the link already has been programmed. Immediately following the application of the programming voltage, the current through the link again is checked to determine proper programming of the link. The system and method provide a continuous verification of the proper programming of the link, including an indication of whether a weak or incomplete programming of a link takes place.

10 Claims, 2 Drawing Sheets

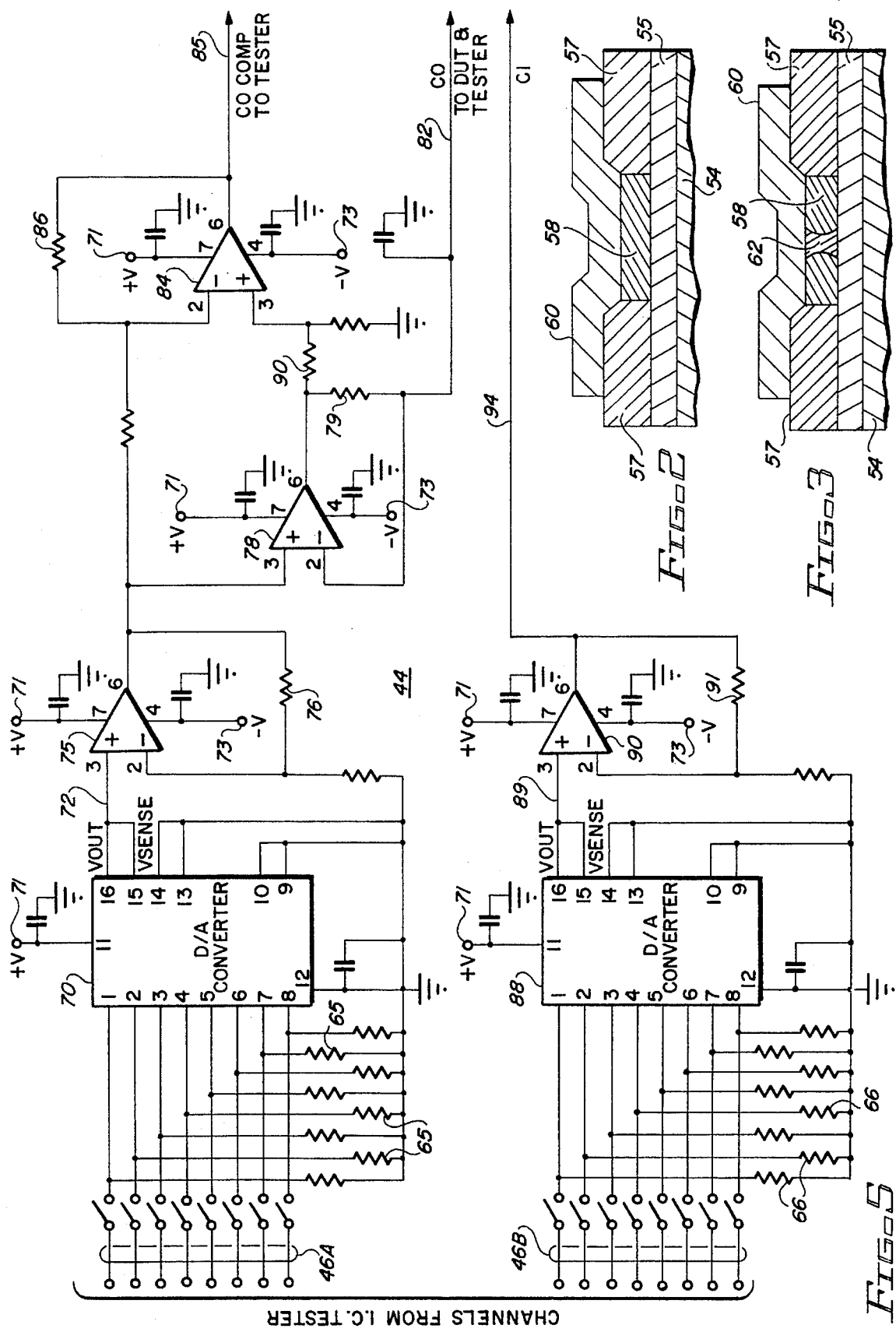

MULTI-LEVEL VROM PROGRAMMING METHOD AND CIRCUIT

BACKGROUND

Programmable, read-only memories (PROM's) are used in a wide variety of applications in the computer and computer related industries. Such memories are marketed in an unprogrammed state, where all of the memory locations initially are programmed with one or the other of the two binary states, "0" or "1". When programming of selected ones of the memory locations to the opposite state is desired, the "X" and "Y" address lines, used to identify that memory location, are enabled, and a programming voltage is applied to those lines to change the state of the memory at that location from the preprogrammed or unprogrammed memory to the opposite state. If a fusible link is used at each of the memory locations to electrically interconnect the conductive "X" and "Y" leads, the programming voltage is used to burn or sever the link to cause the memory position to be non-conductive between the two "X" and "Y" leads. This is selectively done for each of the memory locations which are to be programmed to the opposite state from the unprogrammed memory.

Another type of programmable read-only memory is provided in the form of a vROM memory. A vROM memory initially is manufactured with what may be termed as "antifuses" between the intersection points of the metal conductors for the "X" and "Y" coordinates. This antifuse layer or link is fabricated from undoped amorphous (non-crystalline) silicon, as a high resistance layer between the two metal layers or leads. A programming voltage higher than the normal operating voltage, subsequently to be used with the memory, is applied across the leads to transform the insulating amorphous silicon into conducting polysilicon. Thus, a vROM programmable memory is "open" (insulator) in its original or unprogrammed state, and becomes "closed" (conductive) upon being programmed. In all other respects, this type of memory subsequently may be used in a system in the same manner as the fusible PROM memory discussed above. In the programming of a vROM memory, however, the application of the programming voltage is applied to those memory locations which are to be conductive in the final product, whereas in a fusible PROM memory, the application of the programming voltage is applied to those memory locations which are to become open or insulating in the final programmed state of the memory.

In the programming of vROM memories, a tester circuitry typically is employed during the programming operation to measure the current flow through the programmed links to ascertain or verify the programming operation. The tester used in programming the memory operates first to select the memory location to be programmed. Then a programming potential is applied to an operational amplifier circuit to apply a programming voltage to the selected address. In the case of a vROM memory, this voltage is used to fuse the antifuse region. When the conventional operational amplifier system is used to effect the fusing, a comparator is employed to detect the flow of current through the link being programmed. This comparator flips from one binary condition at its output to another, whenever any current is detected. As a consequence, if the programming of the link or address location is weak or incomplete (resulting in low current flow), the conventional programming system does not detect this potential weakness. Such a failure to completely program the link, however, may result in improper operation of the programmable memory in its subsequent system application. The failure of this type of a programming system to detect weak or incomplete programming is the result of the use of a voltage dropping resistor at the input of the comparator circuit to establish the detection indication.

It is desirable to provide an improved effective, accurate system and method for programming and verifying the programming of vROM programmable memories.

SUMMARY OF THE INVENTION

It is an object of this invention to provide an improved vROM programmer.

It is another object of this invention to provide an improved method for programming vROM programmable memories.

It is a further object of this invention to provide an improved method and apparatus for programming vROM programmable memories and for verifying the accuracy of such programming.

In accordance with a preferred embodiment of the invention, a method for programming and verifying the programming of vROM memories, fabricated with fusible links between two metal layers, includes first selecting or addressing a fusible link in the memory to be programmed. Current flow through this link then is checked to determine whether the link is already programmed. After the check of current flow, a programming voltage, which is higher than a normal operating voltage, is applied across the selected fusible link for sufficient time to fuse a link between the two metal layers at the address location, effectively electrically connecting the layers together at the selected fusible link. After the programming voltage has been applied, the voltage is reduced and current flow through the fusible link is checked to verify that the two metal layers are electrically connected at the link.

BRIEF DESCRIPTION OF THE DRAWING

FIG. 2 is an enlarged cross-sectional view of a vROM link in an unprogrammed state;

FIG. 3 is an enlarged cross-sectional view of a vROM link in its programmed state;

FIG. 5 is a detailed schematic diagram of the vROM programmer section of the system of FIG. 4;

DETAILED DESCRIPTION

Reference now should be made to the drawings, in which the same reference numbers are used throughout the different figures to designate the same components.

Figure 1:
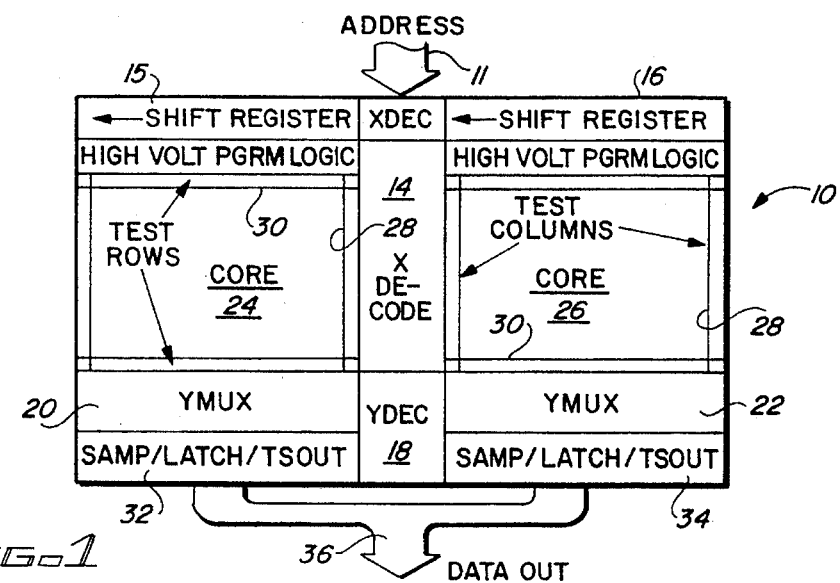
FIG. 1 is a diagrammatic representation of a vROM programmable memory.

FIG. 1 is a diagrammatic representation of a standard, commercially available vROM programmable memory. The representation shown in FIG. 1 may be considered a "floor plan" of such a memory, in which rows and columns (X and Y) are used to address individual address locations within the memory 10. As illustrated in FIG. 1, address signals are applied over a bus 11 to select the specific address location of the memory which is to be programmed. The X or row addresses are applied to a shift register, shown in two sections 15 and 16, and an X-DECODE logic section 14, which contains the X address latches and PRECODE and drive. Shown immediately below the shift registers 15 and 16 is the high voltage programming logic 30, which includes pre-charge driver transistors. This high voltage section contains a charge pump which utilizes a 13 Volt input and the output of an external oscillator to provide the voltage to the appropriate bit line controlled by the data in the shift register 15/16.

The X decoders and core 24/26 are illustrated as located below the programming section 30. To select the Y decode information, a Y multiplex section, shown in two parts 20/22, is utilized in conjunction with the X decode logic to select any bit in any location of the vROM 10 for programming.

The physical partitioning of the vROM 10 is done using a six-bit X-words by 128 bits. The three-bit Y-decode 18 yields sixteen outputs per section. The design also incorporates two test rows 30 and four test columns 28. The test rows (words) are accessed by a test mode and are substituted for word address locations 0 and 63. The test columns (bits) are accessed by the same test mode, and are substituted for Y-decode addresses 0 and 7. These test rows and columns are located about the periphery of each half of the vROM core, as illustrated diagrammatically in FIG. 1. Also built into the vROM 10 is the programming logic necessary to position the programming data and control the programming operation of the vROM. Since this is standard for commercially available vROM's 10, that logic is not shown in FIG. 1. In the programming sequence, the Y decoders 18 remain enabled. Programming of the test rows and columns is under user control, and is not explicitly controlled by logic.

Data output is obtained over a bus 36 from the sample/latch/tsout section 32/34 of the vROM block 10. The section 32/34 contains the individual sense amplifiers, output latch and three-state output drivers. It should be noted that the vROM block itself consists of several basic building blocks of the type shown in the vROM floor plan 10 of FIG. 1.

Each of the block elements or memory locations of the programmable vROM block 10 are configured as illustrated in FIG. 2. Each of the memory elements of the vROM memory 10 originally is fabricated at the cross point of a grid of X address lines 60 and Y address lines 55, the selection of a particular one of each of such lines resulting in a cross point or specific address location.

The lines 60 and 55 are made of metal on a silicon substrate 54. The lines 60 are separated from the lines 55 by an inter-metal oxide layer 57, which is non-conductive. At the cross point of each of the lines, programmable link 58, which is thinner in cross section than the inter-metal oxide layer 57, is provided. The link 58 is made of "antifuse" material. Typically, it is fabricated using undoped amorphous (non-crystalline) silicon to form a high resistance layer between the two metal layers 65 and 60. The memory is originally fabricated in the configuration shown in FIG. 2; so that all of the cross points of the metal conductors 55 and 60 are separated by a non-conductive or "open" link 58.

To program selected ones of the address locations to provide a conductive interconnection between the metal conductors 55 and 60, a programming voltage which is higher than normal operating voltage for the memory is applied across the selected conductors 55 and 60. This programming voltage is high enough to overcome the resistance of the antifuse link 58 to transform the insulating amorphous silicon into conducting polysilicon. This is illustrated in FIG. 3, which shows such a conductive link 62 interconnecting the metal conductors 55 and 60, thereby changing the information stored in the memory stored in that location from one binary condition (such as "0") to another binary condition (such as "1"). As noted above, it is possible to program any bit, in any location of the vROM 10 in accordance with the procedure mentioned above in conjunction with FIGS. 2 and 3. Once the entire vROM 10 has been programmed in accordance with the application in which it is to be used, it then constitutes a permanent read-only memory (ROM) specifically configured for that application.

Figure 4:
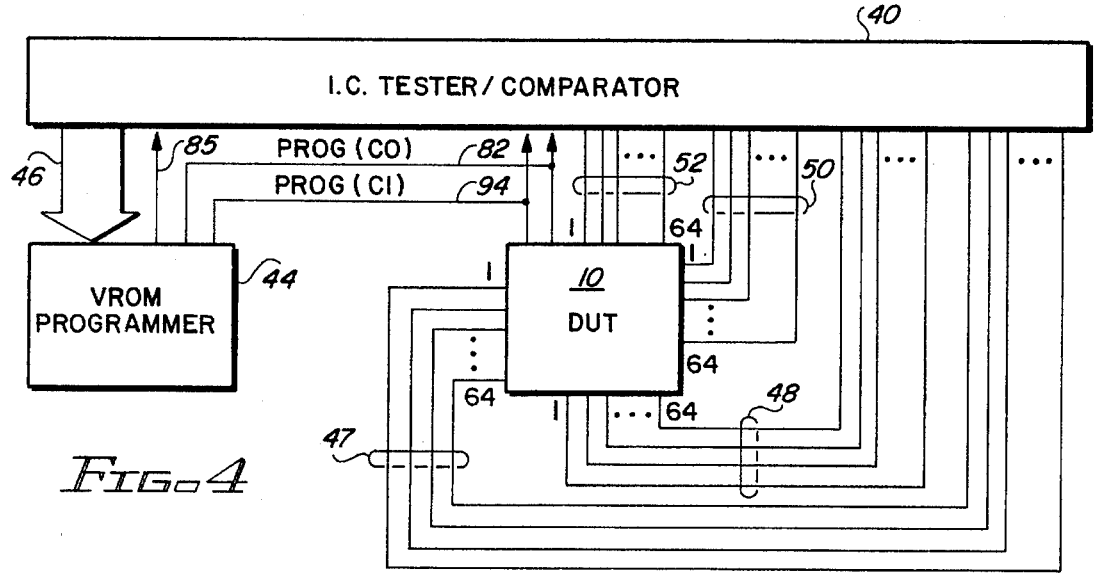
FIG. 4 is a block diagram of a system used in programming a vROM memory of the type shown in FIGS. 1 through 3.

Reference now should be made to FIG. 4, which is a block diagram representation of the system used to program the vROM device 10. As illustrated in FIG. 4, the device 10 is interconnected with an IC tester/comparator 40, which may be any type of industry standard IC tester, such as a Credance STS8256 IC tester. The tester 40 is interconnected with the input/output leads of the vROM to be programmed, as illustrated by the four groups of leads 47, 48, 50 and 52, shown in FIG. 4, interconnecting the device 10 with the tester/comparator 40. Consequently, the memory device 10 is provided with operating potential, ground potential and various input and output signals required to address the memory 10 and to receive information from it by means of the interconnections with the tester 40. The tester 40, in turn, is provided with an operating program for selectively addressing the various address locations within the device 10 being programmed, for supplying clock and operating signals and the like to the memory device 10.

In addition, as shown in FIG. 4, the tester/comparator 40 supplies operating signals to a vROM programmer 44 for causing the programmer to supply signals over a pair of leads 82 and 94, both to the tester 40 and to the vROM 10 which is to be programmed. Another input from the vROM programmer 44 is shown applied over the lead 85 to the tester/comparator 40.

The operation of the programmer 44 for providing the programming voltages, as well as the current verification signals for determining the status of the different memory locations to be programmed in the memory device 10, is illustrated in detail in FIG. 5. As shown in FIG. 5, the bus 46 from the tester/comparator 40 is illustrated as comprising two groups of inputs 46A and 46B. For the purposes of illustration, these inputs are shown connected through series switches to the inputs of a pair of digital-to-analog convertors 70 and 88, respectively. The switches provide a representation of the programmability of different signals supplied to the convertors 70 and 88; although in actual practice, the switching or application of different signals to the convertors 70 and 88 from the tester 40 is effected by means of electronic logic circuits.

The inputs 46A are applied to the digital-to-analog convertor 70; and the inputs 46B are applied to the digital-to-analog convertor 88 across respective pull down resistors 65 and 66, respectively. The circuit 44, shown in FIG. 5, generates various voltage waveforms synchronized to the digital patterns and read current for programming the vROM memory 10 in real time. The purpose of the circuit 44 is to enable the IC tester 40 to generate the high voltage waveforms required to program the selected antifuse links at the different address locations, with a current sensing feedback to the tester 40 by way of a current to voltage convertor in the circuit 44.

Figure 6:
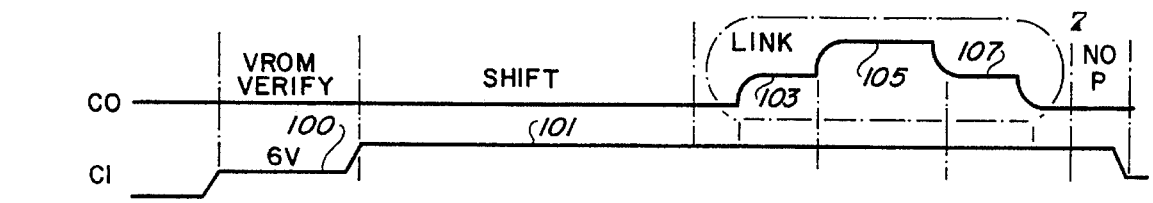
FIG. 6 illustrates waveforms used in conjunction with the circuitry of FIGS. 4 and 5.
Figure 7:
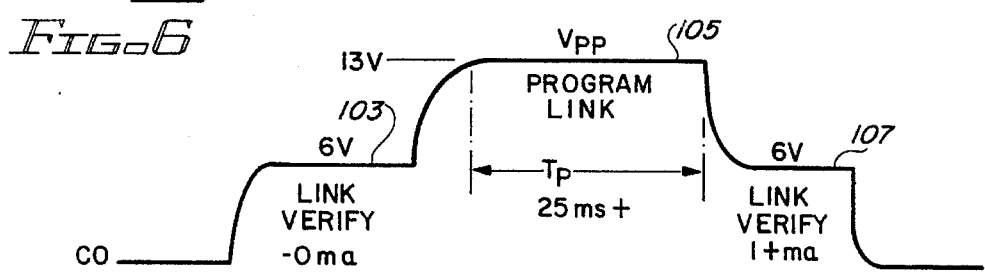
FIG. 7 is an enlarged detail of the portion circled as "7" in FIG. 6.

The operation of the circuit 44 should be considered in conjunction with the waveforms shown in FIGS. 6 and 7. FIG. 6 shows the programming timing diagram for programming each individual programmable link or memory location in the vROM programmable block 10, which is to be programmed or changed to the configuration shown in FIG. 3. To do this, the digital input to the convertor 88, from the tester 40, causes the analog output of the convertor 88 to be provided on the VOUT output to the input 89 of an operational amplifier 90, which is provided with a positive operating potential on the input 71 and a negative operating potential on the input 73, as illustrated in FIG. 5. A feedback resistor 91 interconnects the output of the operational amplifier 90 with its lower (−) input, the output from the convertor 88 being applied over the lead 89 to the upper (+) input of the amplifier 90. The signal on the output of the amplifier 90 is applied over the lead 94 and comprises the signal "C1" shown in FIGS. 4 and 6.

As shown in FIG. 6, when the voltage (C1) on the lead 94 rises to 6 Volts and the voltage (CO) on the lead 82 is 0 Volts, these inputs are used by the tester to verify the operating condition of the vROM 10. This is done through the data out on the bus 36 supplied by the ROM in one or more of the leads of each of the groups of leads 47, 48, 50 and 52 of FIG. 4. This is the "vROM verify" sequence 100 shown in FIG. 6.

After this initial verification, the signals over the leads 46B to the digital-to-analog convertor 88 then are changed to cause the output of the digital-to-analog convertor 88 to be applied over the VOUT output to the upper (+) input 89 of the operational amplifier 90. This comprises "shift" section 101 of the timing diagram shown in FIG. 6. This causes the output signal on the lead 94 to rise to above 6 Volts (C1). This signal is applied to the vROM 10 to operate the shift register sections 15/16 in accordance with the address information applied to the vROM over the bus 11 (FIG. 1) or over selected ones of the leads 47, 48, 50 and 52 of FIG. 2.

With the output of the digital-to-analog convertor 88 stepped to its second step 101, as describe above, the input signals 46A to the digital-to-analog convertor 70 cause an output on the VSENSE output to be applied to the upper (+) input 72 of an operational amplifier 75, which in turn supplies an input to the upper (+) input of an operational amplifier 78 and to the negative or upper input of a differential amplifier 84. A feedback resistor 76 is connected to the lower input of the operational amplifier 75; and a similar feedback resistor 79 is connected to the lower input of the operational amplifier 78 to cause these amplifiers to function in their conventional manner. The resistor 79, however, also functions as a scaling-resistor in a current-to-voltage converter including the differential amplifier 84.

The cascade of the operational amplifiers 75 and 78 causes a link verification voltage and current to be obtained on the outputs 85 and 82, respectively. If the programmable link which is about to be programmed already has been programmed (either through a previous operation or as a result of defective chip design or fabrication flow), current will flow at this time. If this occurs, the output voltage of the differential amplifier 84 indicates this and a corresponding current flow through the output 82 (CO) and the defective link of the vROM 10 takes place. This is detected by the tester 40; and appropriate action can be taken. For a non-defective vROM 10, this check of current flow at the first or left-hand "link verify" position 103 shown in FIG. 7 should be zero Milliamps on the lead 82 and zero Volts on the lead 85, since the link is supposed to be in its high impedance state with the configuration shown in FIG. 2.

If link verification shows that the zero current flow condition exists, the signal over the leads 46A to the digital-to-analog convertor 70 is changed to cause a voltage on the VOUT output of the convertor to be applied to the input 72 of the operational amplifier 75. This voltage is the link program voltage shown in the center section 105 of the waveform of FIG. 7. This voltage is approximately double the normal operating voltage used in the subsequent operation of the programmable vROM. The time duration of the VPP program link 105, as illustrated in FIG. 7, is shown as 25 Milliseconds; but this time may be varied in accordance with the particular parameters of the link shown in FIGS. 2 and 3 to ensure that the "burn time" or "fuse time" is sufficiently long to effect accurate and complete programming of the link.

To ensure that the desired programming of the program link step has been effected, a second verify link check 107 then is made of the link. This is effected by a switching back of the inputs to the digital-to-analog convertor 70 to cause the VOUT output to be applied to the input 72 of the operational amplifier 75. As indicated in FIGS. 6 and 7, the current on the output lead 82 (CO) is greater than 1 Milliamp for a properly programmed fusible link. The scaling resistor 79, used with the operational amplifier 85, causes the current flow through the now programmed link or address location to be reflected in the voltage applied to the lower input of the differential amplifer 84, which has its gain adjusted so that the voltage on the output 85 directly correlates with the current flow through the link on the output 82 from the operational amplifier 78.

Thus, the output of the differential amplifier 84 on the lead 85 is approximately 1 Volt. This direct correlation between the voltage on the lead 85 and the current flow through the link at the address location undergoing verification is utilized by the tester 40 to provide an immediate verification of the actual current flow taking place through the programmed link. Comparators or other implentations may be effected in the tester 40 to determine whether a full current flow or a weak current flow, which would result from weak or incomplete programming, takes place. If the latter situation exists (indicated by a smaller current flow on the output 82 and a lower voltage on the output 85), a reprogramming of that same address location may be effected. If this reprogramming does not produce sufficient current flow, the failure can be noted and appropriate action can be taken as a consequence.

It should be noted that the system provides an immediate and an accurate indication of the proper programming of any selected address location or programmable link with a provision for determining the amount of current, as well as the presence of current flow through a link once it has been programmed. This is accomplished by actively pumping current to the link through the operational amplifier 78, and is not the result of a passive or indirect reading of the type which has been used previously. No voltage drop resistor is employed for the purpose of determining whether a possible programming step has been effected; but instead, positive determination of the actual programming which has taken place is accomplished by means of this system and method.

The foregoing description of the preferred embodiment of the invention is to be considered as illustrative and not as limiting. Various changes and modifications to the invention may be made by those skilled in the art, to perform substantially the same function, in substantially the same way, to achieve substantially the same result, without departing from the true scope of the invention as defined in the appended claims.

We claim:

1. A method for programming and verifying the programming of vROM memories fabricated with fusible links between two metal layers wherein a programming voltage greater than a normal operating voltage is used to selectively fuse links between said two metal layers, said method including the steps of:

selecting a fusible link in said memory to be programmed;

checking first current flow at said operating voltage through said selected fusible link to determine whether said selected fusible link is already programmed;

applying a programming voltage higher than a normal operating voltage across said selected fusible link for a predetermined time to fuse an electrically conductive link between said two metal layers at said selected fusible link;

reducing said programming voltage to said operating voltage; and checking second current flow through said selected fusible link to verify said two metal layers are electrically interconnected at said selected fusible link.

2. The method according to claim 1 wherein the steps recited are effected sequentially in the order listed.

3. The method according to claim 2 wherein said fusible links comprise antifuses.

4. The method according to claim 3 wherein said antifuses are fabricated from un-doped amorphous silicon.

5. The method according to claim 4 wherein the sequential steps are effected automatically by an integrated circuit tester.

6. The method according to claim 2 wherein the sequential steps are effected automatically by an integrated circuit tester.

7. The method according to claim 1 wherein said fusible links comprise antifuses.

8. The method according to claim 7 wherein said antifuses are fabricated from un-doped amorphous silicon.

9. A system for programming and verifying the programming of a vROM memory fabricated with fusible links between two metal layers wherein a programming voltage greater than a normal operating voltage is used to selectively fuse links between said two metal layers, said system including in combination:

an addressing circuit for selecting a fusible link in said memory to be programmed;

a programming circuit coupled to said memory to measure current flow at said operating voltage through said selected fusible link prior to application of said programming voltage thereto to determine whether said selected fusible link is already programmed;

a source of programming voltage greater than a normal operating voltage, selectively coupled to said selected fusible link by said programming circuit to apply said programming voltage to said selected fusible link for a predetermined period of time; and said programming circuit measuring the current flow through said selected fusible link at said operating voltage after application of said programming voltage.

10. The combination according to claim 9 wherein said programming circuit includes a current-to-voltage converter for measuring the current flow through said selected fusible link.

* * * * *